(12) United States Patent
Lavoie et al.

(10) Patent No.: US 8,013,401 B2
(45) Date of Patent: Sep. 6, 2011

(54) SELECTIVELY DEPOSITING ALUMINUM IN A REPLACEMENT METAL GATE PROCESS

(75) Inventors: Adrien R. Lavoie, Beaverton, OR (US); Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1209 days.

(21) Appl. No.: 11/724,569

(22) Filed: Mar. 15, 2007

(65) Prior Publication Data

US 2008/0224235 A1    Sep. 18, 2008

(51) Int. Cl.
  *H01L 29/00*  (2006.01)
(52) U.S. Cl. . 257/407; 257/412; 257/388; 257/E21.476; 438/680; 438/682

(58) Field of Classification Search ............ 257/407, 257/388, 412, E29.001, E21.476, E31.085; 438/680, 682, 683
See application file for complete search history.

(56) References Cited

U.S. PATENT DOCUMENTS

2004/0137688 A1 *  7/2004  Chang et al. .................. 438/303
* cited by examiner

*Primary Examiner* — Thinh T Nguyen
(74) *Attorney, Agent, or Firm* — Rahul D. Engineer

(57) ABSTRACT

A method for carrying out a replacement metal gate process comprises providing a transistor in a reactor, wherein the transistor includes a gate stack, removing at least a portion of the gate stack to expose a surface of a barrier layer, causing a temperature of the reactor be less than or equal to 150° C., introducing methylpyrrolidine:alane (MPA) proximate to the surface of the barrier layer, and carrying out a CVD process to deposit aluminum metal on the barrier layer using a bottom-up deposition mechanism.

5 Claims, 4 Drawing Sheets

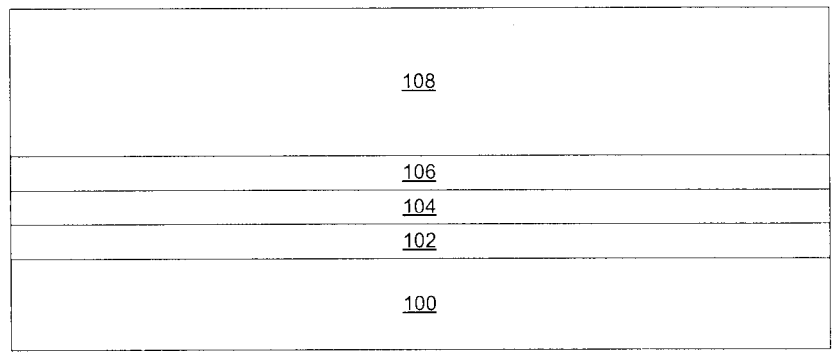
FIG._1A
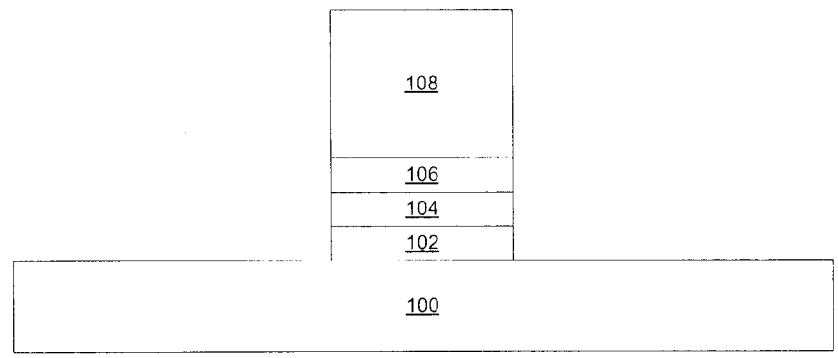
FIG._1B
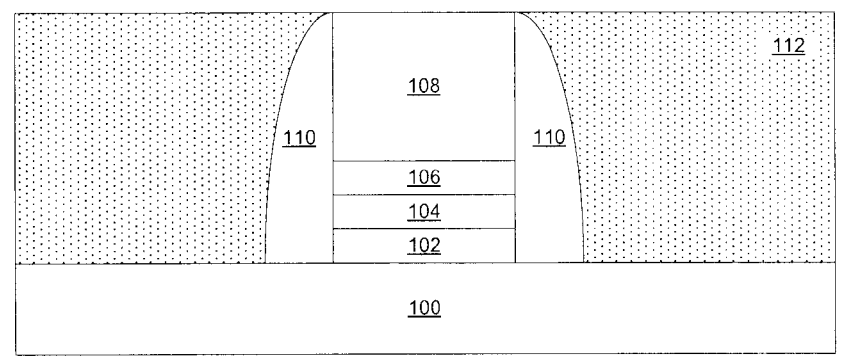
FIG._1C

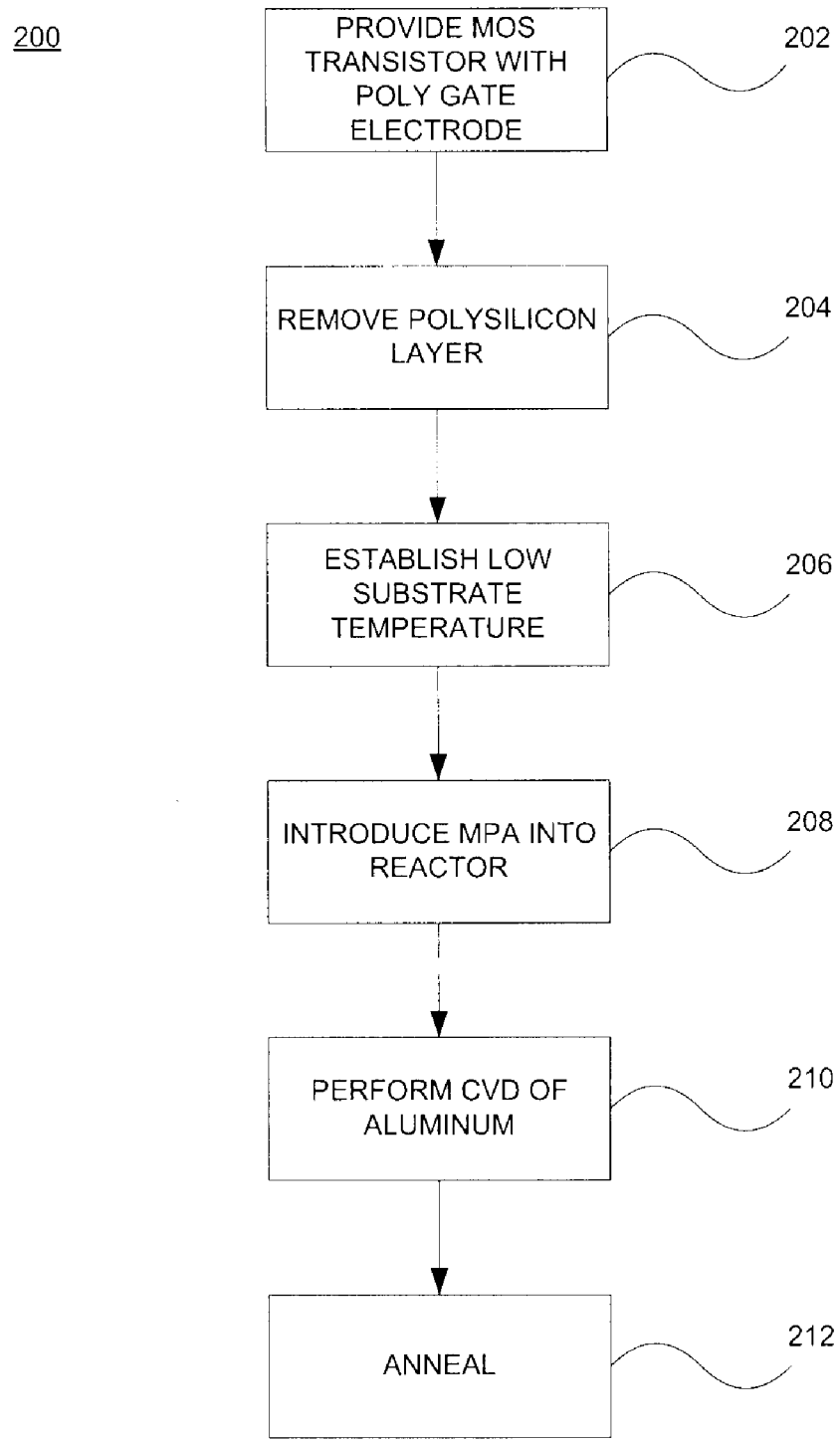
FIG._2

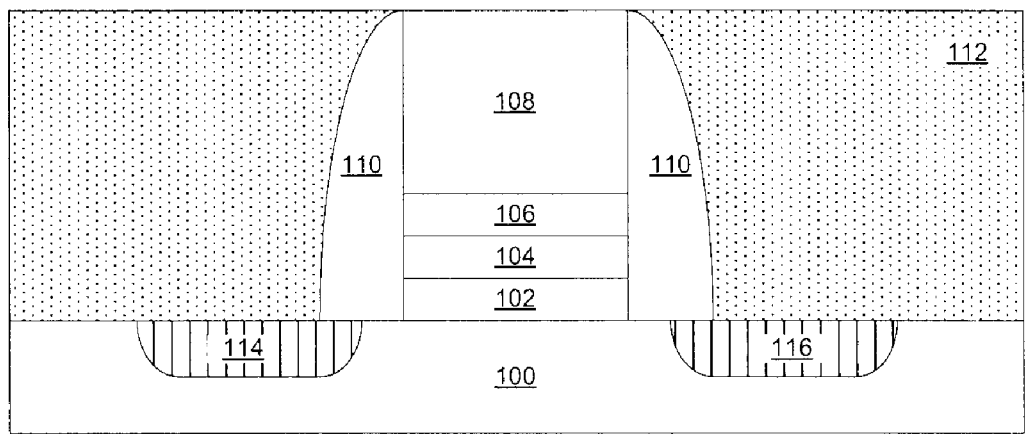
FIG._3A
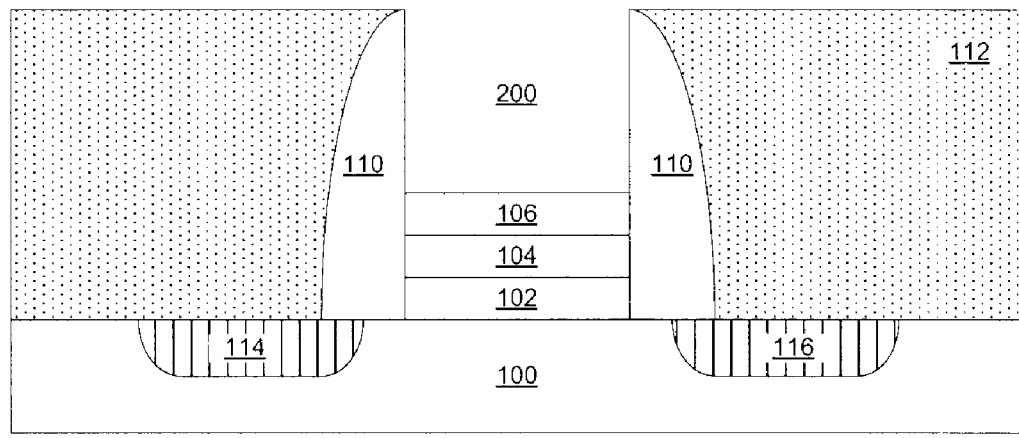
FIG._3B

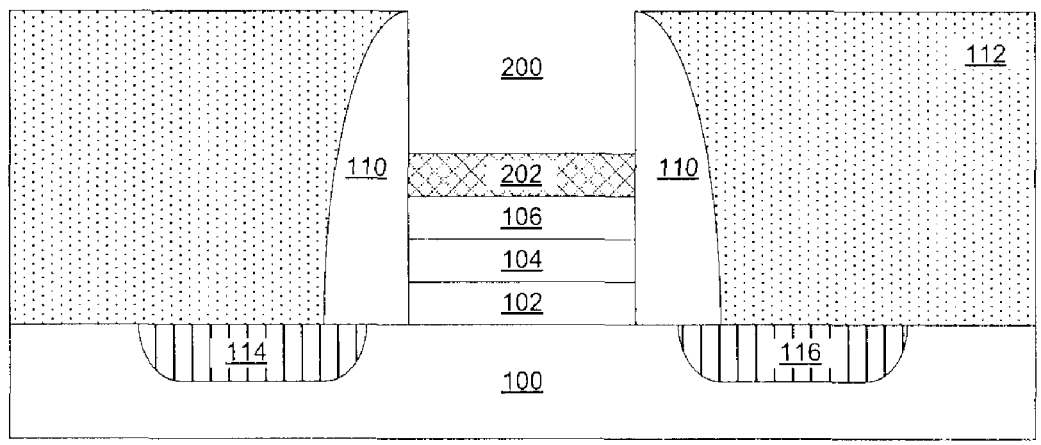
FIG._3C
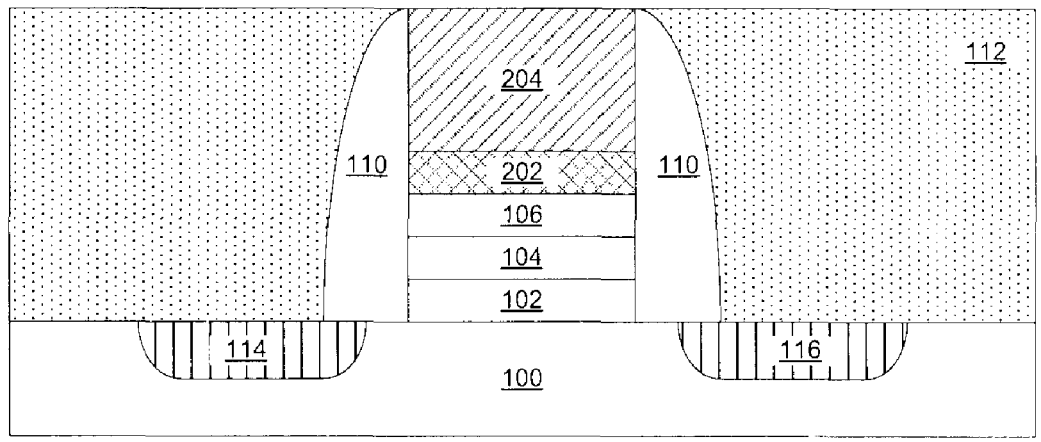
FIG._3D

SELECTIVELY DEPOSITING ALUMINUM IN A REPLACEMENT METAL GATE PROCESS

BACKGROUND

In the manufacture of next generation integrated circuits, the fabrication of gate electrodes for complementary metal-oxide-semiconductor (CMOS) transistors has advanced to replace silicon dioxide and polysilicon with high-k dielectric materials and metal. A replacement metal gate process is often used to form the gate electrode. A typical replacement metal gate process begins by forming a high-k dielectric material and a sacrificial gate between a pair of spacers on a semiconductor substrate. After further processing steps, such as an annealing process, the sacrificial gate is removed and the resulting trench is filled with one or more metal layers. The metal layers can include workfunction metals as well as polysilicon electrode layers. This type of MOS transistor is often referred to as a high-k/metal gate transistor.

One conventional process flow for forming a gate stack for a high-k/metal gate transistor begins by depositing a high-k dielectric layer, a workfunction metal layer, a barrier layer, and a polysilicon layer on a semiconductor substrate. These layers are patterned to form a gate stack and then spacers are deposited and etched. An interlayer dielectric may then be deposited and planarized atop the gate stack and substrate.

It is highly desirable to remove the polysilicon layer and replace it with a metal layer to improve performance and decrease resistance within the gate stack. Unfortunately, after the polysilicon layer is removed from the gate stack, conventional metal deposition processes cannot easily deposit metal into the trench that is left behind. For instance, as CMOS transistor dimensions decrease, issues such as trench overhang and void formation become more challenging and more rampant. This is because at smaller dimensions, the aspect ratio of the trench between the spacers where the metal gate electrode is deposited becomes very aggressive. Accordingly, known processes cannot be used to replace the polysilicon layer with a metal layer.

BRIEF DESCRIPTION OF THE DRAWINGS

FIGS. 1A to 1C illustrate the fabrication of a gate stack for a high-k/metal gate transistor that includes a polysilicon gate electrode.

FIG. 2 is a replacement metal gate process using a novel and selective CVD process in accordance with an implementation of the invention.

FIGS. 3A to 3D illustrate a replacement metal gate process to deposit aluminum metal in the gate stack in accordance with an implementation of the invention.

DETAILED DESCRIPTION

Described herein are systems and methods of selectively depositing a metal layer into a gate stock of a high-k/metal gate transistor. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As used herein, the term high-k/metal gate transistor refers to a MOS transistor that has a gate oxide formed using a high-k dielectric material and a gate electrode that includes at least one metal that is not polysilicon. A conventional process for forming such a high-k/metal gate transistor is illustrated in FIGS. 1A to 1C. Starting with FIG. 1A, a substrate 100 is shown upon which a high-k gate dielectric layer 102, a metal layer 104, an optional barrier layer 106, and a sacrificial layer 108 are deposited.

The substrate 100 may be formed using a bulk silicon or a silicon-on-insulator substructure. In other implementations, the substrate 100 may be formed using alternate materials, which may or may not be combined with silicon, that include but are not limited to germanium, indium antimonide, lead telluride, indium arsenide, indium phosphide, gallium arsenide, or gallium antimonide. Although a few examples of materials from which the substrate 100 may be formed are described here, any material that may serve as a foundation upon which a semiconductor device may be built falls within the spirit and scope of the present invention.

Some of the materials that may be used to form the high-k gate dielectric layer 102 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form the high-k gate dielectric layer 102 are described here, that layer may be made from other materials. Deposition processes such as chemical vapor deposition (CVD) or atomic layer deposition (ALD) may be used to deposit the high-k gate dielectric layer 102. In implementations of the invention, the dielectric layer may have a thickness that ranges from 5 Angstroms (Å) to 50 Å.

The metal layer 104 may be formed using any conductive material from which a metal gate electrode may be derived, and may be formed on high-k gate dielectric layer 102 using well known physical vapor deposition (PVD), CVD, or ALD processes. When the metal layer 104 will serve as an N-type workfunction metal, layer 104 preferably has a workfunction that is between about 3.9 eV and about 4.2 eV. N-type materials that may be used to form the metal layer 104 include hafnium, zirconium, titanium, tantalum, aluminum, and metal carbides that include these elements, i.e., titanium carbide, zirconium carbide, tantalum carbide, hafnium carbide and aluminum carbide. When the metal layer 104 will serve as a P-type workfunction metal, layer 104 preferable has a workfunction that is between about 4.9 eV and about 5.2 eV. P-type materials that may be used to form the metal layer 104 include ruthenium, palladium, platinum, cobalt, nickel, and conductive metal oxides, e.g., ruthenium oxide. The metal layer 104 should be thick enough to ensure that any material formed on it will not significantly impact its workfunction. Preferably, the metal layer 104 is between about 15 angstroms (Å) and about 200 Å thick. Although a few examples of materials that may be used to form the metal layer 104 are described here, that layer may be made from many other materials.

The barrier layer 106, if used, may be formed using materials that include, but are not limited to, titanium nitride and tantalum nitride. The barrier layer 106 serves to protect the gate dielectric and the workfunction layer, for instance, the barrier layer 106 may prevent interaction between the workfunction layer and a subsequently deposited aluminum layer. The sacrificial layer 108 may be formed of a material such as polysilicon and serves as a fill material for the gate stack. When the sacrificial layer 108 is formed of polysilicon, it may also function as a conductive gate electrode.

As shown in FIG. 1B, the layers deposited on the substrate 100 are patterned to form a gate stack. Patterning processes are well known in the art. For instance, one patterning process begins by depositing a photoresist material over the sacrificial layer 108 and patterning the photoresist using ultraviolet radiation and an optical mask to define features such as the gate stack in the resist layer. The photoresist layer is developed to form a photoresist mask that protects the defined features, such as the portion of the underlying layers that will form the gate stack. An etchant is then applied to remove unprotected portions of the underlying layers, yielding a patterned gate stack.

Turning to FIG. 1C, a pair of spacers 110 and an ILD layer 112 are formed on the substrate 100. The spacers 110 are formed adjacent to the gate stack by depositing a material, such as silicon nitride, on the substrate 100 and then etching the material to form the pair of spacers 110. After the spacers 110 are formed, a low-k dielectric material is deposited and polished to form the ILD layer 112. Low-k dielectric materials that may be used for the ILD layer 112 include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layer 112 may include pores or other voids to further reduce its dielectric constant.

It is highly desirable to remove the sacrificial polysilicon layer 108 and replace it with a metal layer to improve performance and decrease resistance within the gate stack. Although processes such as ALD, CVD, PVD, electroplating (EP), and electroless plating (EL) may be used to deposit a metal layer into the gate stack after the sacrificial layer is removed, problematic process issues tend to arise. For instance, as CMOS transistor dimensions decrease down to the 45 nm node and below, issues such as trench overhang and void formation become more challenging and more rampant. This is because at smaller dimensions, the aspect ratio of the trench between the spacers where the metal gate electrode is deposited becomes very aggressive. As will be recognized by those of ordinary skill in the art, metallization of such a high aspect ratio trench quite often results in void formation.

Accordingly, implementations of the invention enable the fabrication of a MOS transistor where the sacrificial portion of the high-k/metal gate stack may be removed and replaced with a void-free metal layer. Implementations of the invention use a novel CVD process that produces a selective, bottom-up gapfill mechanism that avoids trench overhang and subsequent void formation. The metal used in various implementations may be aluminum metal, which is highly desirable for use as a metal gate electrode in combination with a workfunction metal for lower resistance and improved transistor performance. The novel CVD process of the invention may be performed at low temperatures, for instance below 100° C. Furthermore, the implementations of the invention disclosed herein provide a single step process for aluminum gapfill that is selective to the gate stack and avoids aluminum deposition on the ILD layer.

FIG. 2 is a method 200 for a replacement metal gate process using a novel CVD process in accordance with an implementation of the invention. FIGS. 3A to 3D illustrate structures that are formed when the method of FIG. 2 is carried out.

The method 200 begins by providing, in a CVD reactor, a conventional MOS transistor that includes a sacrificial gate electrode over a workfunction metal layer (process 202 of FIG. 2). The sacrificial gate electrode may be formed using polysilicon. As shown in FIG. 3A, a substrate 100 is shown with a conventional high-k/metal gate transistor gate stack formed upon it. The gate stack includes a high-k gate dielectric layer 102, a workfunction metal layer 104, a barrier layer 106, and a sacrificial polysilicon layer 108. Two spacers 110 are formed on either side of the gate stack and an ILD layer 112 is deposited and polished over the device. The MOS transistor may further include a source region 114 and a drain region 116 that are formed in the substrate 100. Methods of forming source and drain regions are known in the art. The MOS transistor shown in FIG. 3A may be formed using the same materials described above in FIGS. 1A to 1C.

Next, the sacrificial polysilicon layer 108 is removed (204). The sacrificial layer 108 may be removed by using wet or dry etching processes, for instance, a wet etch process using tetramethyl ammonium hydroxide (TMAH) or ammonium hydroxide ($NH_4OH$), or a dry etch process using a sulfur hexafluoride ($SF_6$) plasma chemistry. Although the barrier layer 106 will generally remain intact in most implementations of the invention, in some implementations it may be removed using a wet or dry etch chemistry. Turning to FIG. 3B, the sacrificial polysilicon layer 108 is removed, leaving a trench 200 that is located within the gate stack between the spacers 110.

In accordance with implementations of the invention, the substrate temperature may be established at a low process temperature required for a subsequent metal deposition (206). For instance, the reactor temperature may be adjusted to a temperature that falls between around 85° C. and around 150° C., and may typically be established around 115° C.

Next, a flow of methylpyrrolidine:alane (MPA) is introduced into the reactor (208). The MPA may be introduced at a flow rate that falls between around 100 standard cubic centimeters per minute (SCCM) and around 300 SCCM for a time duration that falls between 0.5 seconds and 30 seconds. For instance, in one implementation, the MPA may be volatilized and transferred within a carrier gas stream resulting in a dose rate of around 0.1 milligrams per minute (mg/min) to 0.5 mg/min when the MPA source is maintained at a temperature of around 10° C. to around 50° C. Carrier gases that may be used here include, but are not limited to, argon (Ar), xenon (Xe), helium (He), hydrogen ($H_2$), nitrogen ($N_2$), forming gas, and any mixture of these gases. The pressure within the reactor may range from around 0.01 Torr to around 3.0 Torr.

In the reactor, the MPA tends to react or decompose at the surface of the workfunction metal layer to deposit a thin seed layer that contains aluminum metal. This is shown as aluminum seed layer 202 in FIG. 3C. In accordance with implementations of the invention, the aluminum seed layer 202 formed on the surface of the workfunction layer 104 enables a selective deposition of aluminum metal to occur within the trench of the gate stack.

Following the deposition of the aluminum seed layer 202, a CVD process is carried out to fill the trench 200 with a layer of aluminum metal (210). Conventional CVD processes for aluminum metal using known aluminum precursors may be used here. For instance, the process parameters may be the same as described above for the MPA deposition.

The CVD deposition process selectively deposits aluminum metal within the trench 200. At these process conditions, for instance at a process temperature below 135° C., the CVD process described herein substantially deposits the aluminum metal only on the aluminum seed layer 202 and tends to avoid depositing aluminum on the ILD layer 112. Since the deposition begins on the surface of the aluminum seed layer 202, the CVD deposition process yields a bottom-up gapfill mechanism.

FIG. 3D illustrates the CVD deposition of aluminum metal into the trench 200. As shown, an aluminum gate electrode 204 is formed on top of the aluminum seed layer 202 and the workfunction metal layer 104. Because of the bottom-up fill mechanism of the CVD process, the occurrence of voids or trench overhang is substantially avoided. Furthermore, the aluminum metal does not become deposited on the ILD layer 112 due to the selectivity of the CVD process on the aluminum seed layer 202 at these process conditions.

In some implementations of the invention, an annealing process may be carried out after the deposition of the aluminum gate electrode 204 (212). This annealing process may be used to increase the grain size of the deposited metal, thereby reducing electrical resistance, increasing conductivity, and increasing the purity of the metal. The anneal may be at a temperature that falls between around 100° C. and 400° C. for a time duration that falls between 0.5 seconds and 1.5 hours. The annealing may take place in a forming gas or an inert atmosphere. In some implementations, the forming gas may consist of 4% hydrogen ($H_2$) in argon (Ar) or nitrogen ($N_2$).

In another implementation of the invention, the aluminum seed layer may be formed before the polysilicon layer is deposited. For instance, the process flow may consist of depositing a high-k dielectric layer, a workfunction metal layer, an aluminum seed layer, and a polysilicon layer on a substrate. These layers may then be etched to form a gate stack. Spacer formation and ILD deposition would follow formation of the gate stack. In this implementation, when the polysilicon is etched away, the aluminum seed layer will be exposed for use in the selective CVD process of the invention.

Accordingly, a novel CVD process has been disclosed for selectively depositing an aluminum gate electrode within a gate stack for a high-k/metal gate transistor. The processes of the invention expose the workfunction metal layer and introduce MPA to form an aluminum containing seed layer. The novel CVD process uses the aluminum seed layer to yield a bottom-up gapfill mechanism that substantially minimizes voids and trench overhang. The CVD process occurs at a low enough process temperature that makes the deposition selective to the gate stack, thereby avoiding aluminum deposition on the ILD layer. The methods of the invention therefore enable transistor scaling and migration to the use of aluminum in the gate stack of a high-k/metal gate transistor using a replacement metal gate process flow. The process of the invention is ultra-low temperature and may be readily integrated into existing transistor fabrication process flows.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A MOS transistor comprising:
 a gate stack that comprises:
  a high-k gate dielectric layer formed on a substrate,
  a workfunction metal layer formed on the gate dielectric layer,
  a barrier layer formed in the workfunction metal layer,
  an aluminum containing seed layer formed on the barrier layer from MPA, and
  an aluminum metal layer on the seed layer;
 a pair of spacers formed on laterally opposite sides of the gate stack; and
 a source region and a drain region formed in the substrate.

2. The MOS transistor of claim 1, wherein the high-k gate dielectric layer comprises hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

3. The MOS transistor of claim 1, wherein the workfunction metal layer comprises hafnium, zirconium, titanium, tantalum, aluminum, titanium carbide, zirconium carbide, tantalum carbide, hafnium carbide, aluminum carbide, ruthenium, palladium, platinum, cobalt, nickel, or ruthenium oxide.

4. The MOS transistor of claim 1, wherein the aluminum metal layer is formed using a CVD process at a process temperature at or below 150° C.

5. The MOS transistor of claim 1, wherein the substrate comprises bulk silicon, a silicon-on-insulator substructure, germanium, indium antimonide, lead telluride, indium arsenide, indium phosphide, gallium arsenide, or gallium antimonide.

* * * * *